United States Patent

Zhao et al.

Patent Number: 5,882,411
Date of Patent: Mar. 16, 1999

[54] FACEPLATE THERMAL CHOKE IN A CVD PLASMA REACTOR

[75] Inventors: Jun Zhao, Cupertino; Alex Schreiber, San Jose, both of Calif.

[73] Assignee: Applied Materials, Inc., Santa Clara, Calif.

[21] Appl. No.: 735,386

[22] Filed: Oct. 21, 1996

[51] Int. Cl.⁶ ............................................. C23C 16/00
[52] U.S. Cl. ............................................. 118/715
[58] Field of Search ............................................. 118/715

[56] References Cited

U.S. PATENT DOCUMENTS 5,558,717  9/1996  Zhao et al. ............................. 118/715

Primary Examiner—Richard Bueker
Attorney, Agent, or Firm—Charles S. Guenzer

[57] ABSTRACT

A reactor for plasma-enhanced chemical vapor deposition having a showerhead electrode facing the wafer being CVD deposited, the showerhead having a large number of jetting holes for jetting processing gas towards the wafer. Two deep grooves are formed around the area of the showerhead containing the jetting holes. The grooves are formed from opposite sides of the showerhead and are radially offset from each other, thereby forming a thin wall between the grooves in the body of the showerhead. The thin wall acts as a thermal choke, thus reducing the heat flow to the support of the showerhead and also rendering the temperature distribution more uniform across the face of the showerhead. The thin wall further acts as a mechanical bellows to accommodate differential thermal expansion between the showerhead and its support.

11 Claims, 2 Drawing Sheets

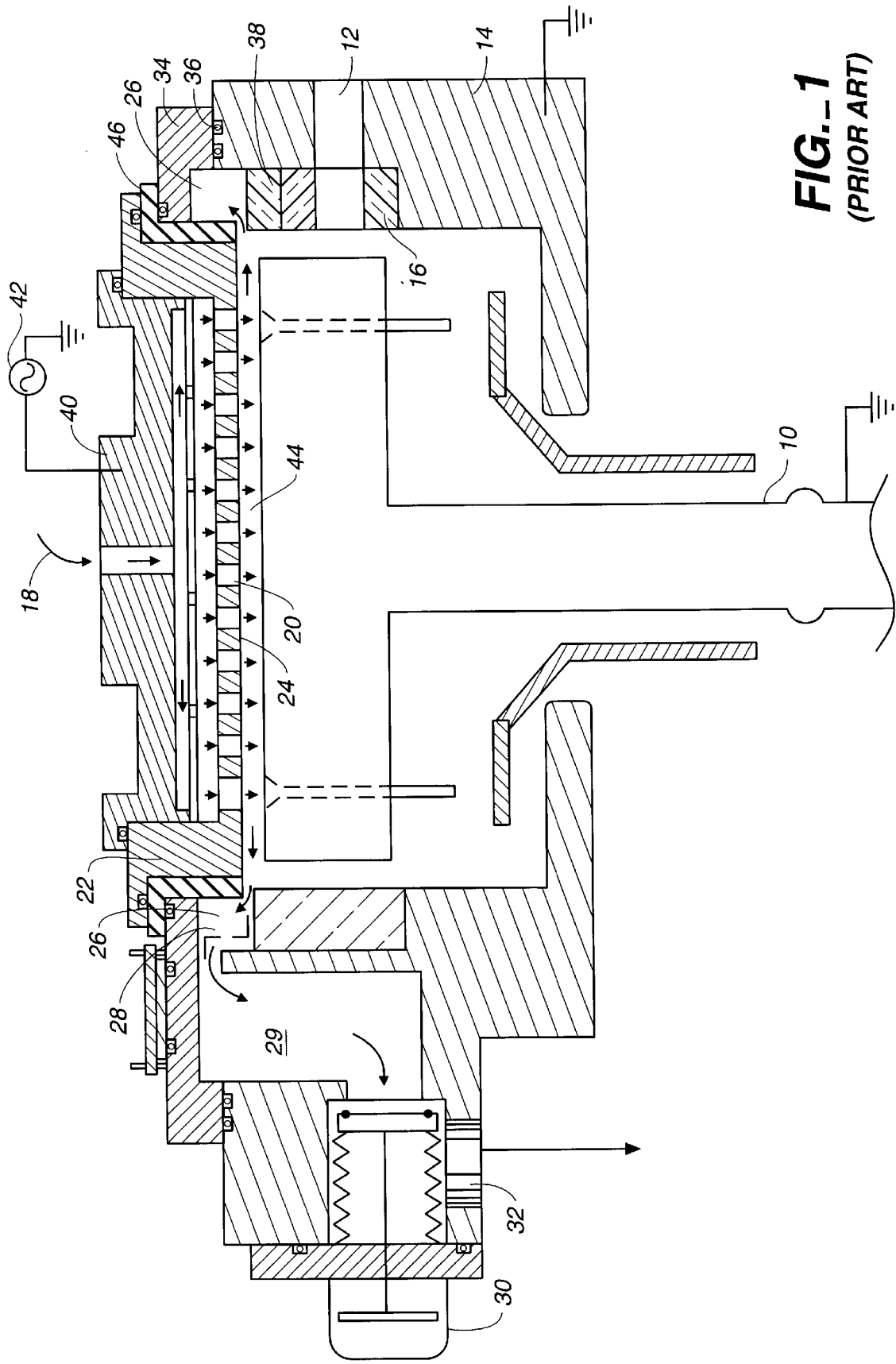
FIG._1 (PRIOR ART)

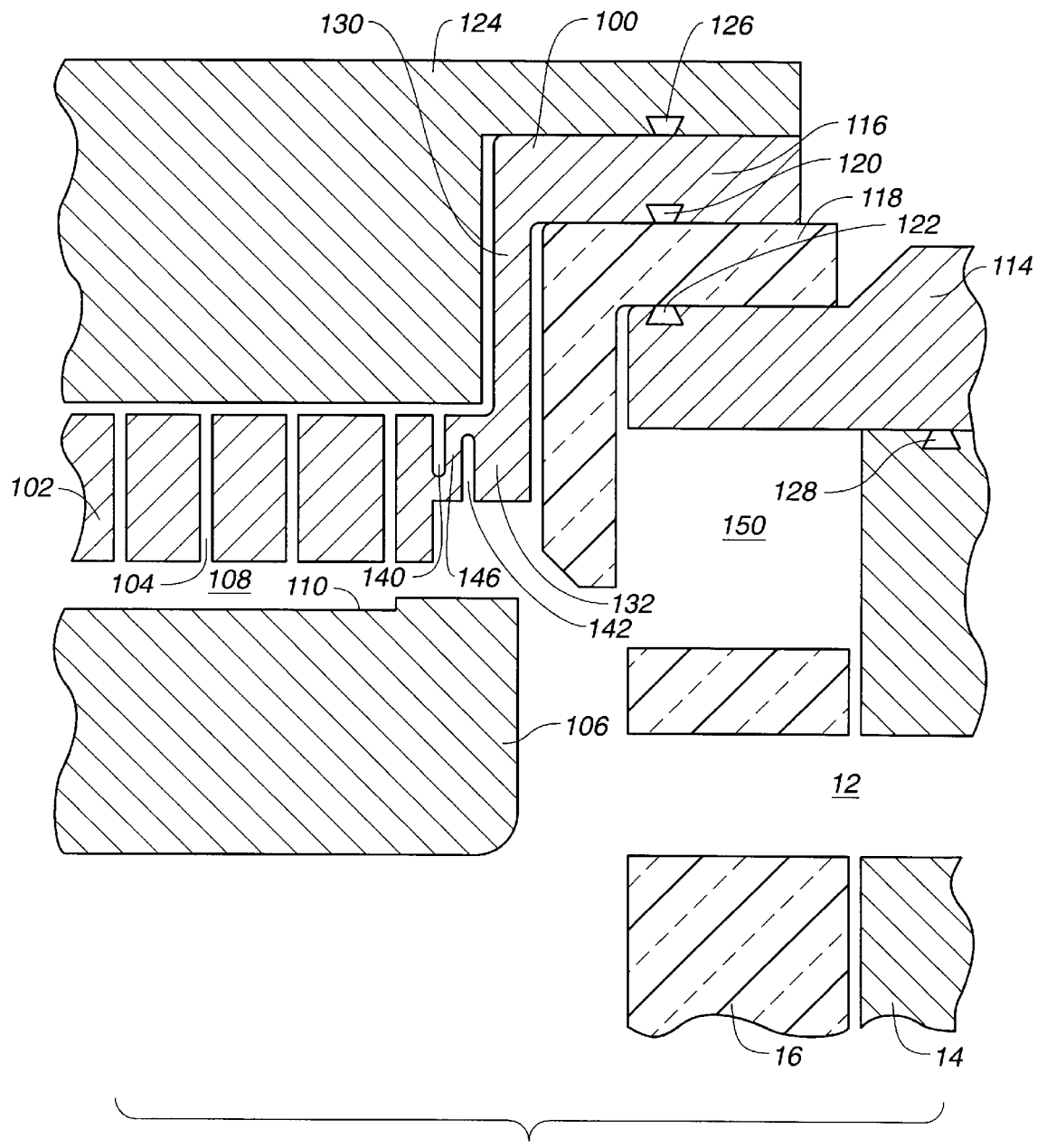
FIG._2

FACEPLATE THERMAL CHOKE IN A CVD PLASMA REACTOR

FIELD OF THE INVENTION

The invention generally relates to equipment for plasma processing of substrates, such as semiconductor integrated circuits. In particular, the invention relates to components involved in the gas flow in a plasma reactor, especially for chemical vapor deposition.

BACKGROUND ART

Chemical vapor deposition (CVD) is a well known process for the fabrication of semiconductor integrated circuits and other layered structures formed on a substrate. In CVD, the semiconductor wafer or other substrate is exposed to a precursor gas at a reduced pressure inside a vacuum chamber. The precursor gas reacts at the surface of the wafer and deposits a component on the wafer. For example, silane ($SiH_4$) is often used as the precursor gas for depositing silicon, and TEOS (tetraethylorthosilicate) is often used for silicon dioxide. There are two principal ways of driving the reaction. If the wafer is heated to a sufficiently high temperature, the reaction is thermally activated. However, for many applications, the temperature necessary for an efficient rate of thermal activation is considered to be too high. In an alternative method, called plasma-enhanced CVD or PECVD, electrical means are used to excite the precursor gas into a plasma. The plasma creates ions and/or radicals of the precursor gas and its components, and these much more readily react. Thereby, the temperature of the wafer can be held fairly low.

An example of a PECVD reaction chamber is described by Zhao et al. in U.S. Pat. No. 5,558,717, incorporated herein by reference. This type of CVD reactor is available from Applied Materials, Inc. of Santa Clara, Calif. under the name DxZ chamber. The CVD reactor of the patent is illustrated in the cross-sectional view of FIG. 1. An unillustrated wafer is supported during processing on a pedestal 10, which can be lowered for the loading and unloading of the wafer into and out of the vacuum chamber through a slit-valve opening 12 in a lower chamber body 14 and a ceramic ring 16 inside the lower chamber body 14.

During deposition, a precursor gas 18 flows through a center-feed distribution system overlying the wafer and through a large number (several thousands) of jet holes 20 in a faceplate 22 composed of a conductive metal, such as aluminum. The gas distribution system is described by Schneider et al. in U.S. patent application Ser. No. 08/734,015, filed Oct. 18, 1996 and entitled INDUCTIVELY COUPLED PARALLEL-PLATE PLASMA REACTOR WITH A CONICAL DOME. The front portion of the faceplate 22 containing the jet holes 20 is called a showerhead 24. As illustrated, during processing the showerhead 24 is closely opposed to the wafer, and its perforated area extends substantially coextensively with the area of the wafer. The processing gas flows through the showerhead holes 20, over the wafer, and then generally radially outwardly to an annular pumping channel 26, generally surrounding the upper edge of the pedestal 10 during processing. The spent gas is exhausted through a restriction 28 in the pumping channel 26 to an exhaust manifold 29. A valve 30 gates the exhaust to an exhaust vent 32 which is pumped by an unillustrated vacuum pumping system.

The faceplate 22 and associated parts are held in a lid frame 34, which is sealed to the lower chamber body 14 by O-rings 36. The lid frame 34 pivots about an unillustrated horizontal hinge and thus can be raised away from the lower chamber body 14 in order to allow technicians to service the interior of the chamber. As shown, the pumping channel 26 is formed between the lid frame 34, the lower chamber body 14, and a second ceramic ring 38 supported through the first ceramic ring 16 on the chamber body 14, but the pumping channel 26 mainly extends into the lid.

The illustrated reactor is intended to be used as a plasma reactor. The pedestal 10 is typically grounded while a cover 40 both electrically and mechanically fixed to the faceplate 22 is connected to an RF power supply 42. Thus, a processing space 44 is surrounded by RF-driven electrodes consisting of the showerhead 24 and the pedestal 10. Sufficient RF power is applied so that the process gas in the processing space 44 between the showerhead 24 and the pedestal 10 is excited into a plasma to activate the CVD reaction on the surface of the wafer. Thereby, the reaction can be carried out at relatively low temperatures with little effect on the thermal budget of the integrated circuit being formed.

The lower chamber body 14 is usually made of a metal such as aluminum and, for safety reasons, is electrically grounded. An annular isolator 46 electrically isolates the RF-driven faceplate 24 from the lid frame 34 and the lower chamber body 14, to which it is electrically connected. The isolator 46 is formed either of a ceramic material, such as alumina or of a sturdy plastic, such as Teflon, both of which provide good electrical isolation.

The chamber of FIG. 1 was designed for 200 mm (8-inch) wafers. Scaling these chambers up for 300 mm (12-inch) wafers presents further problems as well as an opportunity to improve the basic design.

In the reactor of FIG. 1, the temperatures of the faceplate 22 and its showerhead 24 are not tightly controlled. The pedestal 10 is actively heated by resistive coil, but the faceplate 22 is not actively heated or cooled. The temperature of the showerhead 24 is estimated to be about 200° C. because of collisional heating from the plasma and radiative heating from the pedestal 10. Although the temperature tends to equilibrate between the pedestal 10 and the showerhead 24, some of the showerhead heat is sunk through the outer and upper portions of the faceplate 22 to the lid frame 34 and eventually to the lower chamber body 14, as well as to other peripheral attached parts.

Such temperatures are not extreme, but they still cause reliability and lifetime problems in the O-rings sealing the faceplate 22, the lid frame 34, chamber body 14 and other parts. It is thus desirable to reduce the temperature at the back of the faceplate 22.

The heat sinking at the circumference of the showerhead causes at least two related problems. Heat production is substantially uniform over the area of the showerhead, and heat flows to the cooler circumferential area over a path having a substantially uniform thermal conduction. As a result, the center of the showerhead 24 has a higher temperature than the showerhead portions nearer the circumference. The radial non-uniformity in temperature affects the uniformity of the deposition rate and also introduces thermal stresses into the showerhead 24. The thermal stresses cause the showerhead 24 to bow, and the resultant variable gap size of the processing space introduces a non-uniform plasma, yet another source of non-uniformity in deposition. These temperature non-uniformities significantly worsen for the larger wafer sizes.

SUMMARY OF THE INVENTION

The invention can be summarized as a faceplate for a plasma reactor having two circumferential grooves surrounding the faceplate's central area, usually containing a large number of gas jetting holes, thus forming a showerhead. The grooves are formed from opposite sides of the faceplate, are offset from each other in the lateral plane, and are formed deeply enough to produce a thin wall between the grooves. The wall acts as a thermal choke, more effectively thermally isolating the showerhead from its support and vacuum seals. It also acts as a mechanical bellows for accommodating thermal expansion.

BRIEF DESCRIPTION OF THE DRAWINGS

FIG. 1 is a cross-sectional view of a CVD reactor of the prior art.

FIG. 2 is a cross-sectional view of a portion of a CVD reactor of one embodiment of the invention.

DETAILED DESCRIPTION OF THE PREFERRED EMBODIMENTS

The invention provides a thermal choke and mechanical bellows for the showerhead portion of the faceplate in order to better thermally isolate the showerhead from its cooler support and to accommodate differential thermal expansion. The illustrated reactor has been designed for 300 mm wafers, but incorporates many of the features of the 200 mm chamber of FIG. 1.

As illustrated in the cross-sectional view of FIG. 2 of one lateral side of a novel faceplate 100, a showerhead 102 contains a large number of jetting holes 104, only a few of which are schematically illustrated. The showerhead 102 faces a pedestal 106 across a processing area 108. An unillustrated wafer is supported in a recess 110 of the pedestal 106 for CVD deposition from a processing gas jetted into the processing area 108 through the holes 104. An unillustrated electrical heater is held in the pedestal 106 to heat the wafer to the optimum deposition temperature.

The faceplate 100 including its showerhead 102 is supported on a lid frame 114 through a faceplate flange 116 extending radially outwardly and in back of the showerhead 102. An L-shaped annular isolator 118 is disposed between the frame lid 114 and the faceplate flange 116 so as to electrically isolate the electrically biased faceplate 100 from the grounded lid frame 114. O-rings are fit into two O-ring grooves 120, 122 so as to vacuum seal the faceplate flange 116, the isolator 116, and the lid frame 114. A cover 124 for the gas inlet manifold is supported on the upper side of the faceplate flange 116 and is sealed to it by an O-ring in an O-ring groove 126. The cover 124 is both electrically and mechanically fixed to the faceplate and is selectively electrically biased by the RF power supply. The lid frame 114 is sealed to the bottom chamber body 14 by an O-ring in an O-ring groove 128. As mentioned previously, it is desired to reduce the temperature to which these O-rings are exposed.

A cylindrical hanger wall 130 extends vertically between the showerhead 102 and the faceplate flange 116 and is connected to the showerhead 102 through a horizontally extending rim 132 having a thickness less than that of the showerhead 102. The horizontal extent of the rim 132 is accommodated by a thinner hanger wall 130 than the corresponding part of the reactor of FIG. 1.

A thermal choke and expansion bellows are achieved by two deep circumferential grooves 140, 142 formed into the rim 130 of the faceplate 100 outside the area of the jetting holes 104. The grooves 140, 142 are radially offset from each other and are machined from opposite sides of the rim 130 to depths substantially greater than half the thickness of the rim 130. As a result, a thin annular wall 146 is formed between the grooves 132, 134. The mechanical strength of the structure is increased by keeping the thin wall 146 in tension by machining the inner groove 140 from the top of the faceplate rim 132 and the outer groove 142 from the bottom. In a specific embodiment of the invention, the grooves 140, 142 extend about two-thirds of the way through the rim 132 from their respective sides, have widths of 80 mils (2 mm), and are radially offset to produce a thickness of 80 mils (2 mm) in the thin wall 146. The dimensions for the groove and wall widths are preferably within the range of 40 to 160 mils (1 to 4 mm).

This structure achieves at least two beneficial functions, as a thermal choke and as an expansion bellows. The thermal path from the showerhead 102 to the hanger wall 130 and the faceplate flange 116 passes through the thin wall 146, which is substantially thinner than the thicknesses of other portions of the faceplate 116 needed for mechanical support. The thinness of the thermal path through the thin wall 146 causes a large thermal resistance at the thin wall 146, a thermal resistance much greater than that of the showerhead 102 and of the hanger wall 130 and the faceplate flange 116. As a result, a much larger temperature differential develops across the thin wall 146 than across either the showerhead 102 or the combination of the hanger wall 146 and the faceplate flange 116. Therefore, the showerhead 102 develops a relatively uniform temperature distribution, which promotes uniformity of deposition. Also, the correspondingly smaller temperature drop across the hanger wall 146 and the faceplate flange 116, which is heat sunk to a much lower temperature, means that the O-rings in the grooves 120, 122, 126, 128 are exposed to temperatures much less than the 200° C. of the showerhead 102.

The more uniform temperature distribution in the showerhead 102 means that it is subject to less differential thermal stressing and resultant bowing. The bowing is another source of deposition non-uniformities across the wafer.

The continuity of the metallic faceplate 100 around the grooves 140, 142 provides an easily handle member and also provides for electrical contact from the faceplate flange 116 to the showerhead 102 for the RF power applied to excite the plasma in the processing area 108.

Because of the large temperature difference across the thermal choke represented by the deep grooves 140, 142 and associated thin wall 146, the hot showerhead 102 will expand relative to the cooler hanger wall 130. However, the thin wall 146 has a length much longer than its thickness. Therefore, it can flex and bend in the radial direction of the faceplate 100, thereby accommodating thermal distortions while only minimally influencing the position of the showerhead 102. That is, the two grooves 140, 142 act as a mechanical bellows which provides vertical support and vacuum sealing while allowing some horizontal motion. The improved mechanical stability of the showerhead 102 under thermal stressing improves the plasma and deposition uniformities.

A pumping channel 150 is defined, for example, in back of the isolator 122, by the lid frame 118, the lower chamber wall 14, and the ceramic ring 16. Channel liners may be placed on the walls of the pumping channel 150, the exact configuration of which may be optimized for the deposition process and gas flow.

Although the invention has been described with respect to a CVD reactor, a similar design of the faceplate is applicable to an etching reactor, particularly a plasma-enhanced etcher.

The invention thus provides more uniform deposition by alleviating thermal gradients and mechanical deformation, but the improvements are obtained by very simple modifications of existing designs.

What is claimed is:

1. A gas faceplate, comprising:

a generally circular plate;

a plurality of holes passing substantially perpendicularly through said plate in a central circular portion of said plate; and first and second circular grooves formed on opposite sides of said plate surrounding said central circular portion, radially offset from each other, and each penetrating more than half way through said plate so as to form a wall in said plate between said grooves.

2. The faceplate of claim 1, further comprising an annular flange and a wall connecting said flange to a first side of said plate, and wherein said first groove is formed in said first side of said plate and is radially inward of said second groove.

3. The faceplate of claim 1, wherein widths of said grooves and of said wall are in a range of 1 to 4 mm.

4. A substrate processing reactor, comprising:

a vacuum chamber;

a pedestal holding a substrate within said chamber;

a gas faceplate disposed on side of said chamber and having a plurality of jet holes formed therethrough for directing a processing gas toward pedestal; and a gas distribution system disposed on a side faceplate away from said pedestal to supply said processing gas to a back side of said gas faceplate;

wherein said gas faceplate includes at least two grooves formed on opposite sides thereof, surrounding said jet holes, offset from each other within a plane of said faceplate, and extending sufficient respective distances through said plate so as to form a wall between said grooves extending along depths of said grooves.

5. The reactor of claim 4, wherein a first one of said grooves is formed in said back side of said faceplate and is disposed between said second groove and said jetting holes.

6. The reactor of claim 4:

wherein said vacuum chamber includes a chamber body and a lid releasably sealable to said body; and wherein said faceplate is attached to said lid.

7. The reactor of claim 6, wherein said faceplate includes a flange attachable to said lid and a wall extending from said flange away from said lid toward a portion of said faceplate including said grooves and said jetting holes.

8. The reactor of claim 7, wherein a first one of said grooves is formed in said back side of said faceplate and is disposed between said second groove and said jetting holes.

9. The reactor of claim 4, further comprising an RF power source connectable between said faceplate and said pedestal so as to form a plasma in a processing space between said pedestal and an area of said faceplate including said jetting holes.

10. The reactor of claim 4, wherein said reactor is configured for plasma-enhanced chemical vapor deposition.

11. The reactor of claim 4, wherein widths of said grooves and of said wall are in a range of 1 to 4 mm.

* * * * *